Figure 1:
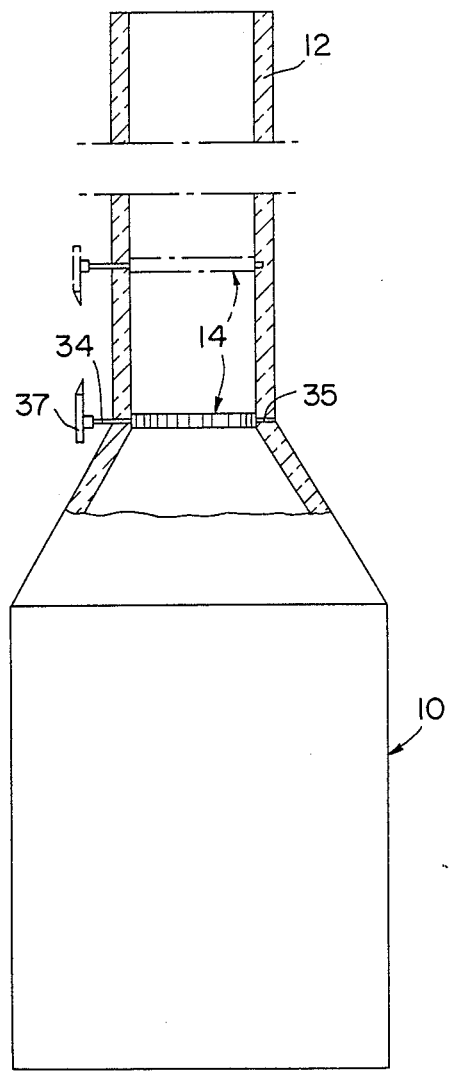

United States Patent [19]
Baldi

[11] Patent Number: 4,957,421
[45] Date of Patent: Sep. 18, 1990

[54] METAL TREATMENT

[75] Inventor: Alfonso L. Baldi, Wynnewood, Pa.

[73] Assignee: Alloy Surfaces Company, Inc., Wilmington, Del.

[21] Appl. No.: 335,240

[22] Filed: Apr. 10, 1989

Related U.S. Application Data

[63] Continuation-in-part of Ser. No. 289,595, Dec. 22, 1988, Ser. No. 205,387, Jun. 10, 1988, Pat. No. 4,895,609, Ser. No. 182,718, Apr. 18, 1988, Ser. No. 28,741, Mar. 23, 1987, Pat. No. 4,927,798, Ser. No. 96,368, Sep. 11, 1987, Pat. No. 4,880,483, Ser. No. 862,712, May 13, 1986, Pat. No. 4,871,708, Ser. No. 707,656, Mar. 4, 1985, Pat. No. 4,824,482, Ser. No. 685,910, Dec. 27, 1984, Pat. No. 4,920,362, Ser. No. 584,538, Feb. 28, 1984, Pat. No. 4,845,139, and Ser. No. 538,541, Oct. 3, 1983, Pat. No. 4,830,931, each is a continuation-in-part of Ser. No. 632,016, Jul. 18, 1984, abandoned, Ser. No. 571,510, Jan. 17, 1984, Pat. No. 4,537,927, Ser. No. 554,441, Nov. 22, 1983, abandoned, Ser. No. 488,103, Apr. 25, 1983, Pat. No. 4,615,920, Ser. No. 417,214, Sep. 13, 1982, abandoned, Ser. No. 281,405, Jul. 8, 1981, Pat. No. 4,708,913, and Ser. No. 172,671, Jul. 28, 1980, Pat. No. 4,435,481.

[51] Int. Cl.$^5$ .................................................. B22F 7/00
[52] U.S. Cl. ................................................ 419/8; 419/9; 419/45; 419/63; 419/69
[58] Field of Search ...................... 419/8, 69, 9, 45, 63

[56] References Cited

U.S. PATENT DOCUMENTS 4,615,920 10/1986 Baldi ................................. 428/652
4,824,482 4/1989 Baldi ................................. 428/652
4,871,708 10/1989 Baldi ................................. 428/680

Primary Examiner—Stephen J. Lechert, Jr.
Attorney, Agent, or Firm—Connolly & Hutz

[57] ABSTRACT

Titanium and titanium alloy surfaces can be diffusion coated, and portions of the surface protected against such coating by localized powdered masking layer of about 43% titanium, aluminum in an amount equal to the aluminum content of the surface masked, as well as other metals in an amount about one-fifth of their content in the surface masked. Diffusion coating can be speeded by high heat input. Diffusion coating packs can be made with chemically reduced metal content of sludges. Diffusion aliminizing followed by caustic leaching to remove much of the diffused-in aluminum, yields catalytically and pyrophorically active porous surface that also accepts top coatings. Mixtures of aluminum powder with nickel and/or iron powders react when heated to form Raney-like product that can be leached to become pyrophoric, and when held on a metal foil or gauze web will adhere to the web so that leached product can be used as pyrophoric foil for decoying heat-seeking missiles. Such adhesion is improved by addition of small amount of copper.

10 Claims, 2 Drawing Sheets

METAL TREATMENT

This application is in part a continuation of applications:

Ser. No. 289,595 filed Dec. 22, 1988
Ser. No. 205,387 filed June 10, 1988 (U.S. Pat. No. 4,895,609)
Ser. No. 182,718 filed Apr. 18, 1988
Ser. No. 028,741 filed Mar. 23, 1987 (U.S. Pat. No. 4,927,798)
Ser. No. 096,368 filed Sept. 11, 1987 (U.S. Pat. No. 4,880,483)
Ser. No. 862,712 filed May 13, 1986 (U.S. Pat. No. 4,871,708)
Ser..No. 707,656 filed Mar. 4, 1985 (U.S. Pat. No. 4,824,482)
Ser. No. 685,910 filed Dec. 27, 1984 (U.S. Pat. No. 4,920,362)
Ser. No. 584,538 filed Feb. 28, 1984 (U.S. Pat. No. 4,845,139)
Ser. No. 538,541 filed Oct. 3, 1983 (U.S. Pat. No. 4,830,931)

The foregoing are in turn direct or chained continuations-in-part of application Ser. No. 632,016 filed July 18, 1984 and subsequently abandoned. Application Ser. No. 571 510 filed Jan. 17, 1984 (U.S. Pat. No. 4,537,927) application Ser. No. 554,441 filed Nov. 22, 1983 and subsequently abandoned, application Ser. No. 488,103 filed Apr. 25, 1983 (U.S. Pat. No. 4,615,920), application Ser. No. 417,214 filed Sept. 13, 1982, subsequently abandoned, application Ser. No. 281,405 filed July 8, 1981 (U.S. Pat. No. 4,708,913) and of application Ser. No. 172,671 filed July 28, 1980 (U.S. Pat. No. 4,435,481 granted Mar. 6, 1984).

The present invention relates to the coating of metal substrates and to activated metals that can be made with the help of such coatings.

Figure 2:
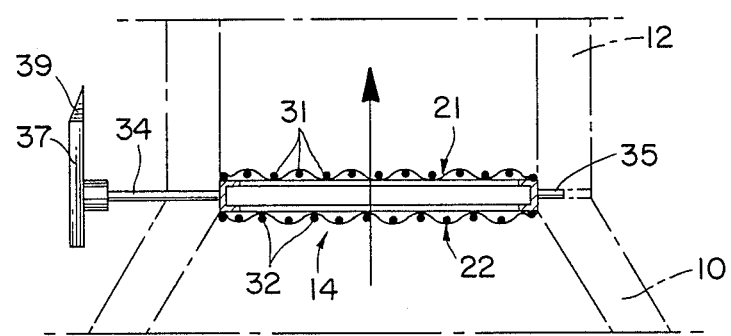
Figure 3:
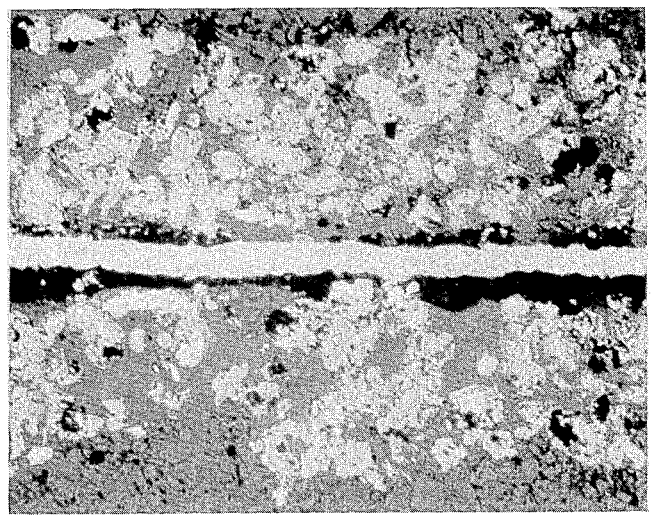
Figure 4:
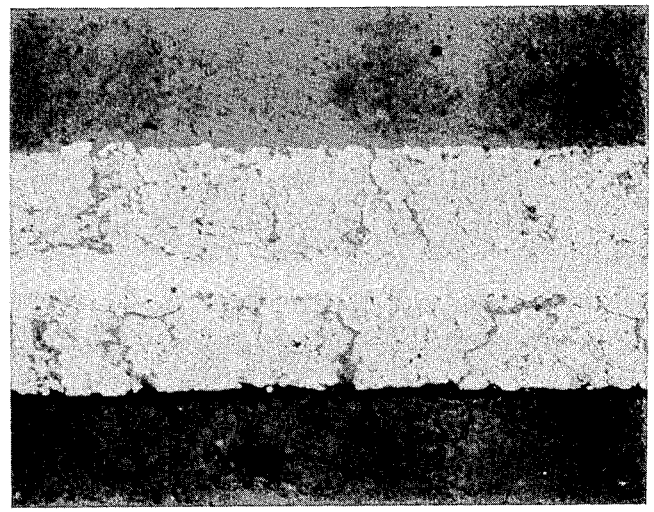

Among the objects of the present invention is the provision of improved techniques and products of the foregoing The foregoing as well as additional objects of the present invention will be more fully understood from the following description of several of its exemplifications, reference being made to the accompanying drawings in which:

FIG. 1 illustrates one use of an activated metal pursuant to the present invention, FIG. 2 is an enlarged sectional detail of the combination of FIG. 1, FIG. 3 is an enlarged photomicrograph of a section through a different activated metal arrangement of the present invention, and FIG. 4 is a similar view of the arrangement of FIG. 3 after it has been subjected to a compacting treatment.

Titanium substrates such as titanium blades for jet engines are generally coated as by aluminizing. Thus the forming of a 0.2 mil to 0.5 mil thick aluminized case by the following techniques provides a high degree of protection that does not appear to detract from the strength of the substrate and does not require the use of top coatings such as described in application Ser. No. 554,441 or application Ser. No. 632,016 Such top coatings can, however, be applied with advantage over the thus-aluminized titanium, even when the aluminized case is about 2 mils thick.

EXAMPLE I

Jet engine compressor blades made of titanium alloy Ti-6Al-4V are cleaned by blasting with glass or alumina frit and then aluminized in a pre-fired diffusion coating pack having 20% powdered aluminum by weight, the balance powdered alumina. The pre-firing is conducted at 700° C. for ten hours without a workpiece with the pack held in an Inconel retort under an argon atmosphere and with $\frac{1}{2}$% anhydrous aluminum chloride added by weight of the pack. After the pre-firing the pack can be permitted to cool, the retort opened, and the pack transferred to a fresh retort where the titanium blades are embedded in it as the fresh retort is loaded. No aluminum chloride or other energizer is added to the fresh retort.

The aluminizing step is also conducted at 700° C. for ten hours in an argon atmosphere. After cool-down the blades are removed from the pack and are found to have an aluminized case uniformly about one mil thick. They do not need further protection except for the most severe uses in which event they can be top coated with several layers of the teflon-containing magnesium-chromate-phosphate coating of U.S. Pat. No. 3,948,687 to build the top coating thickness up to about 0.5 mil. After each layer the coated blade is baked at 650° F. for thirty minutes and the final product after cleaning shows exceptional resistance to corrosion with or without a machine burnishing.

Top coatings containing powdered and/or flake aluminum can also be used.

Similar good corrosion resistance is obtained with other titanium alloys containing at least about 80% titanium, such as Ti-6Al-2Sn-4Zn-6Mo, and even with pure titanium. In general, the aluminizing should be conducted at temperatures below about 875° C. to avoid crystallographic changes that weaken the titanium. Also, unless the aluminizing temperature is at least as high as 1000° F., the aluminum case produced by the foregoing technique is less than 0.5 mil thick even after prolonged heating times.

In the foregoing example a very small amount of chloride can be detected in the pre-fired pack after the pre-firing. If the usual $\frac{1}{2}$% AlCl$_3$ is added to the pre-fired pack after the pre-firing so that it is present during the diffusion coating heat, the aluminized case that forms is very irregular in thickness and can have a maximum thickness of two mils or more. In addition, the aluminized surface is of etched appearance so that its strength and other physical characteristics suffer. Similar undesirable results are obtained with ammonium chloride or ammonium bifluoride energizers in the diffusion coating heat, although these can be satisfactorily used in the pack pre-firing operation when no energizer is added for the diffusion coating heat.

An energizer like anhydrous water-insoluble CrCl$_3$ has less of an undesirable effect, yet will speed the diffusion coating step when present in about $\frac{1}{2}$% or higher concentration on the diffusion coating pack. Titanium halides are even better but are very volatile and more awkward to use.

Aluminizing of the titanium blades of the foregoing example with the diffusion coating pack not pre-fired, or pre-fired without added energizer, also provides satisfactory and uniform aluminized cases, although the diffusion coating speed is somewhat reduced. As in the prior aluminizing art, the aluminum content of the diffusion coating pack can be as low as about 2% by weight, or as high as about 60% by weight, and other inert diluent powders such as kaolin can be used in place of the alumina diluent.

The aluminized titanium products of the present invention with aluminized cases 0.2 to 2 mil thick cases are exceptionally hard, at least Rockwell C-50, with the case essentially TiAl$_3$ together with whatever alloying ingredients were originally present in the titanium substrate. These alloying ingredients preferably total not over 20% to 30% of the substrate Substituting for the aluminum in the pack an aluminum alloyed with 12% silicon speeds up the aluminizing so that a diffusion case about 0.5 mil thick is produced even at 540° C. and a 2 mil thick case at 700° C. These cases also are essentially TiAl$_3$ exceptionally hard. No substrate etching is found and very little of the silicon transfers to the case. With such a substituted pack a 0.2 mil hard aluminized case is formed at temperatures as low as 885° F. using a diffusion coating process otherwise as in Example I. This is the minimum case thickness desired. As noted, the aluminizing with or without the silicon in the pack aluminum is also speeded by using TiCl$_2$ or other titanium halide as the energizer, in concentrations of ¼% to ¾% of the coating pack Such energizers do not cause significant etching of the titanium substrate. Where the titanium halide vaporizes very readily it can be added to the pack in a frangible or fusible container that ruptures or melts at an elevated temperature below the coating temperature. Alternatively, the titanium-halide-energized pack can be used to coat in a so-called glass-sealed retort as in U.S. Pat. No. 2,851,375.

The presence of about 1% to about 10% titanium powder distributed through the coating pack helps keep the titanium substrate from excessive loss of strength.

The total time at diffusion temperature need not be over about 14 hours and, as noted, at least about a 0.2 mil TiAl$_3$ case thickness should be present to give the desired high hardness and significant durability. The titanium substrate to be diffusion coated can have a titanium content of as little as 70% or preferably at least 80 to 90% by weight, with the usual alloying ingredients such as vanadium, aluminum, silicon, and the like.

Titanium workpieces can also be protected by carburizing and/or boronizing, nitriding or carbonitriding as described in U.S. Pat. Nos. 3,784,402 3,787,223 and 3,787,245. This type of protection is promoted by top coatings of the aluminum-particle-containing compositions. The magnesium chromate of such top coating compositions is their key bonding ingredient regardless of the nature of the surface it coats inasmuch as magnesium chromate in the absence of all phosphorus compounds generally used with it, yields results only slightly poorer than those obtained with the help of the phosphorus compounds. Aluminum, calcium and zinc chromates are not as desirable as magnesium chromate for the maximum high-temperature protection, and are best used only with their phosphorus compounds.

The aluminized titanium substrates do not show the roughness described in application Ser. No. 488,103 for age-hardenable stainless steels. The top coatings referred to in that parent application can also be applied with advantage to aluminized titanium or other substrates.

The above-mentioned incorporation of about 1 to about 10% titanium powder in the coating pack slows down the coating rate, whether the coating be aluminum, boron, nitrogen or other material. A 10% content of titanium powder reduces the coating rate by about 40 to about 50%.

Further increases in the content of titanium powder can completely prevent coating Thus a 30% content will cause the pack to absorb so much coating that no significant coating can be discerned on the substrate even after about 18 hours at heat.

Pack formulations containing titanium powder can be applied to localized areas of workpieces to prevent the coating of those areas by surface post-alloying with aluminum, boron, nitrogen or the like. For this purpose the titanium content in the pack should be at least about 35% to assure the desired masking effect, and the thickness of the masking layer at least about 3 millimeters. For best results the masking formulation should contain about 43% titanium diluted with an inert powder such as alumina or kaolin or magnesia. Inasmuch as such high titanium concentrations can cause alloying ingredients in the workpiece to diffuse out from the workpiece to the mask, and to inhibit such loss, the mask preferably contains such alloying ingredients in addition to the titanium. The most preferred masking formulations thus contain about 43% by weight titanium powder plus an aluminum metal content equal to the aluminum content in the pre-alloyed workpiece, and in addition a content of other metals equal to about one-fifth their content in the pre-alloyed workpiece.

By way of example, for localized masking against the boronizing or aluminizing of Ti-6Al-4V, a very effective formulation is:

43%—titanium
6%—aluminum
0.8%—vanadium
balance—alumina

For similarly masking Ti-3Al-11Cr-13V , the preferred formulation is:

43%—titanium
3%—aluminum
2.2%—chromium
2.6%—vanadium
balance—alumina

These highly effective formulations can have their ingredient percentages varied plus or minus about 10% without significantly detracting from their effectiveness. The formulations should also be broken in by a pre-heat to between about 750° to about 1000° C. for about 4 to about 15 hours with about ½ to about 1% activator added. Suitable activators are NH$_4$Cl and NH$_4$Br. A 980° C. pre-heat for 10 hours is preferred. The masking compositions can be applied to the workpieces as a slurry in a vaporizable liquid like water or methylchloroform, and the coated workpiece then packed in place in the pack of a coating retort before the coating dries and loosens. Alternatively a little binder such as poly(ethylmethacrylate) resin can be added to the masking composition as a 1 to 3% solution in methylchloroform, for example, to hold the masking coat in place during the coating heat. Where the heat is hot enough to drive off such resin binder and loosen the mask, non-fugitive binders such as bentonite can be used.

Aluminizing of titanium or any other substrate can be effected in very short times by specially heating a workpiece embedded in an activated powder pack, with a thermal input that brings it to diffusion coating temperature and completes the diffusion coating all in about 50 minutes or less. During this short interval the activator present in the pack begins to be volatilized at a relatively rapid rate that persists about 45 minutes, even if only present in the pack at a concentration of 0.5% by weight, and the formation of the diffusion coating case is extremely rapid. Thus, a 2 mil aluminized case is produced only about 30 minutes after starting to heat an iron or steel workpiece to 980° C. in a pack of:

| | |
|---|---|
| 10 parts by weight | Aluminum powder about 100 microns in size |
| 45 parts by weight | Chromium powder about 10 microns in size |
| 50 parts by weight | $Al_2O_3$ about 100 microns in size | with 0.5% $NH_4Cl$ mixed in and based on the weight of the pack, if the workpiece reaches temperature in 15 minutes. The resulting aluminized case can have non-uniform thicknesses.

It is preferred to have the workpiece covered by no more than about ½ inch of activated pack when it is heated, inasmuch as the pack acts as thermal insulation and slows down the penetration of the heat to the workpiece from the walls of the retort in which it is held during the heating. With the workpiece embedded in a pack held in a cylindrical retort having a 7-inch length and a 2-inch diameter, so that about ½-inch pack thickness envelopes the workpiece, heat supplied at the rate of at least about 200,000 BTU per hour per pound of workpiece will effect the desired heat-up to temperatures as high as 1000° C. During such heat-up the retort can have one or both its ends loosely covered to permit escape of gases, and can be held in a larger retort through which hydrogen or argon is flowed at a slow rate to flush out the escaping gases.

It is not necessary to arrange the workpiece so that it comes to within ¼inch of the retort as described in U.S. Pat. No. 3,824,122. Indeed, the presence of a ½-inch thick pack covering is preferred when practicing the rapid diffusion coating of the present invention inasmuch as it assures the presence of sufficient energizer even when the energizer content of the pack is only 0.5% or less by weight. The energizer content can be increased, for example, to 1% or 2%, and where the workpiece contains a narrow passageway the wall of which is to be diffusion coated as in U.S. Pat. No. 4,347,267, the passageway can be filled or have its wall coated with a diluent-free mixture of activator and the metal to be coated on the wall.

A retort packed in accordance with the rapid diffusion coating technique of the present invention can contain a number of workpieces. There is no need to position each workpiece into its own carefully dimensioned closely fitting retort as in U.S. Pat. No. 3,824,122.

Diffusion coating at temperatures no higher than about 540° C., as in diffusion aluminizing to activate substrates, is even more readily accomplished in short periods of time—not over 45 minutes of heating is generally needed to bring the workpieces to temperature and obtain an aluminized case at least 1 mil thick. Thinner cases require only about 30 minutes or even less. Zinc and aluminum can both be very effectively and very rapidly diffusion coated onto other metals at the foregoing low temperatures.

To further save time the cooling of the diffusion coating retort is best effected by withdrawing it from the furnace in which the heating is carried out. Exposed to the ambient air and with the help of the flushing gas stream between the work-holding retort and an outer retort, the cylindrical retort assembly described above cools in about 15 minutes to the point that the outer retort can be opened and the inner retort withdrawn, exposed to the atmosphere and emptied. In this way the entire diffusion coating sequence including the completion of the cool-down takes only about an hour or 65 minutes. This compares with the 1½ hours disclosed in U.S. Pat. No. 3,824,122 for just the heating time. The cool-down can also be accelerated by blowing air over the cooling retort assembly or by lowering it into a quenching liquid such as water.

U.S. Pat. No. 3,117,846 suggests a powder pack diffusion heating for one-half hour, but that time does not include the time needed to bring the powder pack and the workpiece to the diffusion coating temperature. Such heat-up time is generally a number of hours if the continuous treatment technique of U.S. Pat. No. 3,824,122 is not used.

Pack chromizing is generally not conducted at temperatures below about 600° C., so that it cannot be completed as rapidly as the most rapid pack aluminizings. However, a few hundred degrees increase in diffusion temperature only takes a few minutes longer to attain by the foregoing rapid heat-up technique.

The diffusion coating packs can be prepared by mixing together the individual pure ingredients, or from other sources such as scrap materials that contain one or more of the desired ingredients. Thus, chromium hydroxide sludges precipitated from used chromium plating or anodizing or leather tanning baths, are difficult to dispose of without creating environmental problems. A similar problem is faced by sludges from used nickel, cobalt and copper plating solutions, and from iron-loaded pickling rinses. Such sludges are, however, readily converted to pack diffusion ingredients as by drying and then reacting them with metallic magnesium, as described in U.S. Pat. No. 3,801,357, French Patent No. 1,123,326 and French Addition Patent No. 70,936. Such treatment converts chromium hydroxide to metallic chromium, while the magnesium is converted to magnesium oxide which acts as inert refractory diluent for the metallic chromium when the mixture is used as a diffusion chromizing pack.

The presence of aluminum hydroxide and other insoluble heavy metal compounds in the sludge need not interfere with the use of the magnesium-reacted product as a diffusion coating pack A relatively large content of iron can, for example, be tolerated where the articles to be diffusion chromized have a substantial iron content. Most metals to be diffusion-coated are alloys containing many ingredients, and the presence of the corresponding ingredients in the diffusion coating packs in small amounts does not create problems. It is generally preferred that the contaminating metals be present in the sludge at a concentration less than 20% based on the total weight of the metal in the sludge. For this computation, only the metal portion of the compounds in the sludge are considered.

To minimize expense the content of metallic magnesium after the magnesium treatment is best kept quite low, as by using a stoichiometric or less than stoichiometric proportion of magnesium for that treatment, or by vacuum evaporating any residual magnesium metal to recover it. Insufficient magnesium will leave a little unreacted oxide of the sludge metal in the reduced mixture, but this metal oxide does no harm where the same metal is being diffusion coated. Indeed, a little dried but otherwise untreated sludge can be added to a used diffusion coating pack to make up for the metal that has diffused out. During the course of the next diffusion coating run with that replenished pack, some or all of the added metal hydroxide is converted to metal by the halide-containing hydrogen generally used as the diffusion coating atmosphere.

Excess magnesium in the sludge-reduction can also be tolerated. Some excess will evaporate off during the sludge-reducing heat but 1% to 2% residual magnesium in a chromizing pack is helpful and improves the chromized product.

The reducing action of the magnesium is effected by magnesium vapor, and the reducing step is generally conducted at a temperature of from about 760° C. to about 1100° C. in an inert or reducing atmosphere. The mixture resulting from the reducing reaction ordinarily has its components so tightly held to each other mechanically that they are difficult or impossible to separate by mechanical treatment. According to the present invention, however, no such separation is needed.

The following is an illustrative example:

EXAMPLE II

A chromium hydroxide sludge containing about 4% iron and 5% aluminum, based on the weight of its total metal content, has its pH adjusted to between 8 and 9 with ammonia or acetic acid, and is then dried at 1250° C. The resulting cake is ground and 900 grams of the ground product is poured over a 500-gram mass of magnesium in a steel pipe retort which is then loosely covered and placed in an outer retort having inlet and outlet lines for supplying it with a controlled atmosphere.

The retorts are then heated to 870° C. and kept within plus or minus 250° C. from that temperature for 10 hours, while a stream of argon is flushed through the outer retorts. At the end of that time period the retorts are cooled to room temperature, the argon flow then stopped, and the reacted product removed. It is a very fine mixture of magnesium oxide powder and reduced metal.

That mixture is then used as a pack chromizing powder to chromize a 1010 steel rod. About ½% by weight NH₄Cl is first added to and distributed through the mixture, and the resulting material used to pack the steel rod in a diffusion coating retort. The diffusion heat is conducted as described in U.S. Pat. No. 3,801,357 at 1900° F. for 12 hours. After cool-down, the chromized rod shows a high quality chromized surface. The small amount of aluminum originally in the sludge is apparently not effective to detract from the quality of the diffusion coating, and neither is its iron content.

Instead of using the magnesium-reduced sludge for a pack that causes its metal content to diffuse into a workpiece, it can be used as a masking mixture that prevents such diffusion coating. This is demonstrated in the following example:

EXAMPLE III

A concentrated sludge from the precipitation with soda ash of the nickel salts in a used nickel plating rinse bath is neutralized, dried and reacted with half its weight of magnesium as in Example II to produce a nickel-bearing powder. This powder is then slurried in a solution of ethyl methacrylate in methyl chloroform as described for the top masking layer in Example I of U.S. Pat. No. 4,208,453, and the slurry used in the aluminizing process of that Example. A very good masking is obtained.

Metallic aluminum is not as volatile as and does not behave like magnesium to effect the sludge reduction. Molten aluminum does reduce chromium oxide with which it comes into contact but the reduced metal tends to dissolve in or alloy with the molten aluminum and thus dilute the reducing action, eventually bringing it to a halt. A similar difficulty is also experienced with nickel oxide reduction, but not with iron oxide reduction.

Sludges of low-melting metals like aluminum, zinc and cadmium can be reduced with magnesium to also produce products useful for diffusion. Some oxides like zinc and aluminum oxides are more difficult for magnesium to reduce, and when present in chromium sludge, for example, will generally not be completely reduced, particularly if no excess of magnesium is used. This feature can be utilized to content of such difficultY reduced metals in a sludge containing more readily reduced materials that are of primary interest.

The foregoing very rapid diffusion coating technique is particularly suited for preparing pyrophoric articles such as the foils described in U.S. Pat. No. 4,292,208. A mass of such articles can be mixed up with the diffusion coating powder and very quickly aluminized as a batch. The aluminized articles can then be sifted away from the powder and leached to remove enough aluminum to make them pyrophoric.

Aluminizing and leaching sequences can be used to provide a porous metal surface that better receives coatings, regardless of pyrophoricity. Thus, a jet engine hot section turbine blade made of B-1900 superalloy can be heavily aluminized at about 600° C. to form an aluminized case 2 to 4 mils thick, after which the treated blade is subjected to boiling 30% NaOH in water for 12 hours to leach out most, if not all of the aluminum from the case. The blade surface is now very porous and can be kept under water to prevent pyrophoric reaction with air.

The porous-surfaced blade is now dipped into an aqueous 1% solution of platinum chloride and absorbs a substantial quantity of the platinum chloride in its pores The resulting blade dried in an inert atmosphere or still wet is now inserted in a diffusion aluminizing retort and subject to chromaluminizing at about 980° C. for about 6 hours, as described in U.S. Pat. No. 3,801,357, or to corresponding simple aluminizing as described in U.S. Pat. No. 4,347,267. The final blade has a surface, the outer 2 to 4 mils of which contain platinum and aluminum in quantities that provide considerable resistance against high temperature attack by engine combustion products. Because the last diffusion coating is effected at a temperature which decomposes the platinum chloride into its elements, the platinum in the final blade is in metallic form and is quite uniformly distributed, probably as a platinum aluminide.

Other metals such as rhodium and other platinum family metals can be similarly impregnated relatively deeply into a workpiece. The coating of other nickel-base superalloys as well as of cobalt-base superalloys can be improved by the foregoing preliminary porosity-treatment sequence and diffusion coatings of chromium or other metals can be substituted for or added to the final aluminizing or chromaluminizing.

Metals like yttrium, hafnium and lanthanum that have protective oxides can be correspondingly impregnated in the form of a decomposable soluble salt like the sulfate or nitrate, and a workpiece thus impregnated heated to decompose the salt to oxide, and then diffusion aluminized or chromaluminized or chromized.

Very finely divided protective metals such as the MCrAlY, MCrAlHf and MCrAlZr alloys known in the art, but having particle sizes of about one micron or less can also be absorbed into the foregoing porous workpiece surfaces from dispersions in a liquid such as water, and then sintered in place by heat treatment that preferably effects at least a little diffusion into the surrounding metal. A final aluminizing or chromaluminizing or chromizing, which can be combined with the sintering step, acts to fill in the residual porosity remaining after the impregnating step.

The foregoing porosity is more effective than the porosity obtained by the partial surface depletion described in U.S. Pat. No. 4,041,196.

Aluminizing can be used with a subsequent leaching to prepare pyrophoric foils of the nickel or iron, as described above, and even to correspondingly prepare pyrophoric metal powder. Such pyrophoric powder can alternatively be prepared by leaching aluminum or zinc out of a crushed alloy of these metals with iron, nickel or the like. The resulting pyrophoricity can be used to trigger exothermic reactions to greatly increase the thermal output. Thus, pyrophoric iron powder made from iron-aluminum alloy also containing as little as 2% to 6% boron, generates much more heat and reaches temperatures as high as 1095° C. Such powders can be mixed with other readily ignited materials of high-heat output, as for example, powdered magnesium, lithium, boron, aluminum, titanium, carbon, silicon, uranium—preferably depleted from U-235 separation, molybdenum, tungsten, tantalum, vanadium, thorium, zirconium, beryllium and osmium. The mixed powders can be held together with a small amount of binder or can be compressed into discs or the like, and should contain sufficient pyrophoric metal t heat all of the mixture to ignition, and at least about 50% by weight is preferred.

The powder can be compressed with the help of metal honeycombs or screens as described in U.S. Pat. application Ser. No. 643,782 filed July 17, 1984 (U.S. Pat. No. 4,815,386).

Such a pyrophoric powder or powder mixture can be used as a thermal decoy against heat-seeking missiles, as by projecting them into the air from a sealed container. They can, for example, be compressed or bonded into discs or rods and projected in that form Such decoy materials can also be given radar chaff characteristics, as by inserting them into thin-walled aluminum or copper tubes about an inch long or longer—for example, 6 to 8 inches A quantity of such powder having particles about 20 microns or less in size can be extruded with the help of a polyethylene or polystyrene binder into elongated rods about 7 to 15 mils thick, and the rods wrapped in a turn of aluminum foil ¼ to 2 mils thick. The wrap can be held in place by the binder, using heat or solvent to cause it to adhere to the extruded rod or to a small overlap of the wrap. Cutting such a wrapped assembly into suitable lengths, preferably leaving the cut ends open so that air can get to the powder within the wrap, can complete the production, but care should be taken to conduct all of the steps while the powder is protected as by a film of water, from contact with oxygen.

Instead of or in addition to the open ends of the cut lengths, the wrap itself can be perforated to permit more ready access of air to the wrapped powder. On the other hand, such access can be hindered by increasing the proportion of binder to powder, and/or impregnating the powder particles with colloidal inert particles as described in application Ser. No. 281,405 or with slowly volatilized liquids as described in application Ser. No. 571,510.

Pyrophoric particles having different delay times, e.g., from one second to 30 seconds, can be mixed with each other and with the ignitible substrates, to extend the burning times.

Preformed tubes can also be used to hold the pyrophoric powder. Such tubes can be extruded and then have their wall thickness reduced as by chemical milling.

Regardless of how an activated leached iron or nickel surface is obtained, it can be used for many catalytic purposes including the oxidation of methane, and such use is improved by depositing on the surface a film of platinum or palladium, or a thin layer of fine zirconium oxide powder. Metal films are readily deposited by electroplating or in the case of platinum-family metals by decomposing the chloride or other salt of such metal. Powders can be applied by mixing them with colloidal alumina or silica in suspension in water, then applying the suspension and finally permitting the water to evaporate. The $ZrO_2$ changes the wave length of the radiation emitted when the activated surface pyrophorically reacts.

When diffusion aluminizing thin substrates such as iron foil only a few mils thick for the preparation of a pyrophoric product, the operation can be speeded up by applying the aluminum to the surface of the substrate and intensely heating the substrate to cause the applied aluminum to rapidly diffuse into its interior When the aluminum is applied in liquid form, even greater speeds are attained. For these thin substrates the diffusion penetration need only be about one or two mils, and at a temperature of about 815° C. this can be effected in a few minutes.

Thus, a two-mil thick, one-inch wide type 1010 iron foil can be Schoop coated with about a 1½-mil thick layer of molten aluminum as the foil is unwound from a supply coil and passed into an argon box where it is induction heated to about 760° C. After five minutes of such heating, the foil is ready for the leaching step that renders it highly pyrophoric. The aluminum can alternatively be applied as a dispersion of powder in an aqueous or organic liquid that volatilizes away.

Instead of argon in the box, other protective gases such as nitrogen and hydrogen can be used, as described for example in U.S. application Ser. No. 281,405. The foil will begin to deform at about 1050° C. and by keeping within about 275° C. of that softening temperature, the heat treatment can be reduced to about three minutes. The same 275° C. below softening is also effective with other substrates such as nickel that deform at temperatures at least as high as 815° C.

Electric resistance heating, radiant heating, and even flame heating can be used instead of dielectric heating. Flame heating is preferably applied against the aluminum-coated surface of the foil using a flame fed by a gaseous combustion mixture of hydrogen and oxygen or air containing sufficient oxygen or air to enable suitable combustion, but insufficient to add a significant amount of oxygen to the atmosphere in the box.

As noted above very rapid aluminum diffusion generally produces aluminized cases of irregular depth.

The addition of a little magnesium metal to a chromizing pack gives improved chromized cases. This is shown by the following comparison.

EXAMPLE IV

A batch of first stage PWA 1455 blades for the hot section of a jet engine are cleaned by degreasing in trichloroethylene and then lightly blasting with 220 grit alumina propelled by an air jet at 30 psig. The blades so cleaned are embedded in the following pack, all percentages being by weight

| Powdered chromium | 1.2% |
|---|---|
| Powdered nickel | 2.4% |
| Powdered aluminum | 0.37% |
| Powdered alumina | 96.03% |

All of the powders are minus 325 mesh, their particle sizes ranging from about 20 to about 50 microns, and the mixture well homogenized with repeated siftings, then further mixed with $\frac{1}{2}$% NH$_4$Cl and $\frac{1}{2}$% MgCl$_2$ and placed in a chromized steel retort before the blades are packed. The packed retort is then covered by an outer retort as described and illustrated in U.S. Pat. No. 3,785,854 care being taken that the outer retort has no leaks and is well sealed. The atmosphere in the outer retort is displaced by a stream of argon introduced through an inlet conduit opening near the bottom of the interior of the outer retort and exited through an outlet conduit opening near the top of the interior of the outer retort. Heating of the retorts is initiated and the flow of argon maintained through the entire heat at a rate that assure essentially no entrance of air or moisture into the interior of the retorts. Where the outer retort has no leaks, an argon flow of about 5 standard cubic feet per hour is adequate.

The pack is held at 1050 to 1075° C. for 30 hours after which heating was terminated and the retorts permitted to cool, the argon stream being maintained. The retorts can be opened when the pack temperature cools to about 150° C., the blades unpacked, cleaned with a blast of air, and washed with water.

The blades have a very good chromized case 0.6 to 1.2 mils in depth, with no alphachrome and no objectionable oxide increase seen on metallographic examination.

The foregoing chromizing pack is used without a breaking heat, and has so little metal content that it can be discarded after a single use. If desired, its metal content can be salvaged as by pouring a stream of the used pack through a horizontally moving air stream which deflects away the lighter particles, permitting the metal particles to be collected.

When the pack of Example Iv is modified by incorporating in it about 0.1% magnesium metal, it produces chromized cases with even less undesirable oxide visible on metallographic examination, and of particularly high quality.

In general the pack of Example IV can have a chromium content of from about 0.6 to about 2%, a nickel content from about $\frac{1}{2}$ to about 3 times the chromium content, and an aluminum content about 1/10 to about $\frac{1}{2}$ the chromium content. The magnesium addition is preferably from about 0.5 to about 2%. The argon atmosphere of that example can be replaced in whole or in part by helium, neon or other inert gas or mixtures thereof. Other inert diluents like kaolin can be substituted for the alumina in its pack.

The used diffusion coating packs of Example IV contain a small amount of nickel-aluminum-chromium alloy and can be utilized as masking mixtures in low-temperature aluminizing, that is aluminizing conducted at not over about 760° C. Thus the use pack can be mixed with 1/5 its weight of a 6% solution of poly(ethylacrylate) and the mixture applied by dipping over the roots of similar blades to build up a coating weighing 500 milligrams per square centimeter. The masked blade are then embedded in the following powder pack, the percentages being by weight

| Alumina | 85% |
|---|---|
| Aluminum-silicon alloy (88% Al) | 15% | to which is added $\frac{1}{2}$% NH$_4$Cl.

A coating heat in hydrogen with a 30 minute hold at 735° C. deposits a 10 milligram per square centimeter coating over all unmasked surfaces. The blades are then removed from the pack, the masking mixture brushed off, and then heated in hydrogen having a minus 37° C. dew point for 4 hours at 1080° C. to diffuse the aluminum coatings into the surfaces. They are then rapidly air cooled to below 540° C., aged for 10 hours at 870° to 900 ° C. , and again rapidly air cooled to give blades ready for use with roots only chromized and with their airfoil surfaces chromized and then aluminized.

When a carbon-containing binder is used to hold a masking mixture in place, it can sometimes leave a little extra carbon on the substrate surface covered by the masking mixture. While such carbon deposition is not significant in substrates that contain a substantial carbon content, such deposition can be reduced or completely eliminated for substrates that contain only a small carbon content or none at all. Thus nitrocellulose and bentonite are effective binders that leave behind little or no carbon. Nitrocellulose can thus be dissolved in nitrobenzene or nitromethane, and bentonite can be mixed with water, to each form binders to which the masking powders are added to make a masking slurry or mud.

The minimizing of carbon residue is particularly desirable when masking the so-called single crystal superalloy vanes and blades for the hot section of a jet engine. The fore going binders that do not deposit any significant carbon are accordingly particularly suited to provide slurry coatings for masking such diffusion aluminizing or masking diffusion coating with other metals.

For best results the single crystal superalloy workpieces are masked with binder-free masking mixtures. Also for such purposes the nickel and any other metal in such masking mixtures should be free of detectable carbon. In addition the breaking in of such a masking mixture should not expose it to significant quantities of carbon. Thus the retort used for the break-in is preferably a carbon-free or low carbon content metal.

Parent application Ser. No. 862,712 describes the activation of brasses with mineral acids or ammonium persulfate. Such activation of brass can also be used to activate other catalysts used for the hydrogen-reduction of CO to methane. It is particularly effective when a caustic leach is used in place of the acid leach, for activating stainless steel catalysts use with $NH_3$ or other reducing gases to reduce the $NO_X$ content of furnace stack gases where the furnace is fired with coal or oil. A stainless steel catalyst for the above purpose is in the form of a metal wire screening in which the spacings between the screen wires define passageways about 30 to about 200 mils wide. The wires themselves can have a thickness from about 5 to about 30 mils.

Such screening can very conveniently span across a flue passage so that all the flue gases pass in intimate contact with the screen wires and there is minimum obstruction to gas flow. It is generally desirable to provide a stack or series of screens in the flue, particularly where the gas velocity is high, to assure adequate contact of the moving gases with the activated catalyst.

Such a screen arrangement packs a great deal of active catalyst surface in a modest space, and will not trap too many particulates that may be carried by the gas. Thus by making the openings between screen wires about 100 mils or greater, the passage of ash particles and even some carbon flakes, is not seriously obstructed Where a stack of two or more screens is used, the adjacent screens can be spaced a little from each other to minimize the trapping of particulates. Also with spacings of at least about 100 mils between adjacent wires, it is helpful to have pairs of screens with one screen of the pair offset from the other by about half that spacing. This helps assure that all portions of the moving gas came sufficiently close to the active catalyst surfaces.

Another feature of the use of screens, is that a screen or a pair or stack of screens can be held in place in a manner that permits turning upside-down, so that particulates trapped against the bottom of a screen by upwardly flowing flue gas can be blown off by the gas when the screen is upside-down. The catalytic screens can be generally flat members hanging vertically in the path of a laterally moving stream or a vertically moving stream of flue gases Horizontally positioned screens can also be mounted in the path of a horizontally moving flue gas stream.

An iron-base alloy containing by weight at least about 10% chromium, preferably at least about 15% chromium provides very effective catalyst surfaces. Although pure iron or low carbon steel can be used, their catalytic efficiency is lower. The catalytic surface can contain as much as 20% aluminum by weight inasmuch as not all the diffused-in aluminum need be removed. It is preferred to only remove about 30 to 60% of the diffused-in aluminum. Energized pack diffusion will form very good diffusion cases at the crossover points of screens, where crossing wires contact each other. Thus a type 410 stainless steel wire screen is easily diffusion coated to form an aluminized case about 2 mils thick with the case thickness variation within plus or minus 10%. Upon leaching with aqueous caustic the resulting activated surface is more efficient than the activate layers described in U.S. Pat. Nos. 4,040,981 and 4,206,081. A diffusion case 1.5 mils thick gives even better results.

Pack or vapor diffusion is also a convenient technique for introducing the chromium into an iron or steel to provide the surface alloy into which the aluminum is to be diffused. Vanadium, manganese, tungsten, molybdenum, copper, titanium and tin can likewise be introduced into an iron substrate by such techniques, with or without the chromium, to also improve the catalytic action obtained after activation by the aluminum diffusion and subsequent leaching. Alternatively any or all of these adjunct metals can merely be plated on the iron substrate so that they diffuse into it during the aluminum diffusion.

EXAMPLE V

A 20-mesh screen of 16 mil thick type 430 stainless steel wire was embedded in a powder pack of 20% by weight 10 micron aluminum and 80% by weight 325 mesh alumina, with ½% by weight $AlCl_3$ added to the pack as energizer. Diffusion was effected in a hydrogen-blanketed atmosphere at 510° to 540° C. for 20 hours, as described in U.S. Pat. No. 3,764,371, after which the coated screen was dropped into aqueous 16 to 20% NaOH where it was reacted for 2 hours. The screen so leached was then rinsed off and shows an active microporous layer about 1.3 mils thick. It is ready for the denitrations described in U.S. Pat. No. 4,040,981 or if desired for the pre-denitration treatments described in that patent as well as in U.S. Pat. No. 4,206,081.

Other chromium-containing iron-base alloys can be similarly treated. Alloys containing more than about 50% chromium by weight are not preferred. Austenitic, martensitic and ferritic stainless steels are suitable base materials.

Instead of starting by aluminizing stainless steel screening, screening of ordinary low carbon steel such as type 1010 can first be chromized, using either a pack diffusion as in Example II or a gaseous diffusion as in U.S. Pat. No. 3,222,212.

These as well as other techniques for chromizing as well as for applying molybdenum, vanadium, titanium, copper and tungsten as well as their carbides, nitrides, borides and silicides, are described in the text Vapor Plating by C. F. Powell, C. E. Campbell and B. W. Gonser, Copyright 1955 by John Wiley & Sons, Inc. Decarburizing a steel makes it more suitable for chromizing.

As with chromium, it is preferred that the coated surface of the iron substrate contain at least 10% and not more than 50% of the molybdenum, manganese, vanadium, titanium, copper, tungsten or tin, or of combinations of these metals with or without the chromium. This concentration is only needed in the outermost 1 or 2 mils of the iron surface. During the subsequent aluminizing and leaching to activate the surface, the activated case that is formed has about 2 to 4 times the thickness of the metal depth from which it is formed. Accordingly a 1 mil penetration of chromium or vanadium, for example, will be expanded to over 2 mils in the activated product. As little as 5% of these alloying metals can be used.

The expanded surface is quite porous and also contains added aluminum, and as much as about 40% of the aluminum that diffused in, can remain after the leaching operation. A vigorous leaching also loosens and removes most, if not all of the very porous layer formed on stainless steel during the initial portion of the leaching, particularly if that porous layer is thicker than 1.5 to 2 mils. Notwithstanding such loosening the resulting stainless steel is a very active $NO_X$-reducing catalyst although its life might be shortened.

The content of chromium or vanadium or other adjuvant in the metal surface after mild leaching is only about 8/10 to 9/10 its content before activation. After vigorous leaching that removes the porous layer, the fraction drops to 5/10 or less.

Where the adjuvant metal is applied as a top plating to the iron substrate for subsequent diffusion into the iron surface, sufficient plating should be applied to obtain a subsequent penetration of at least about 0.5 mil before aluminizing, or 1 mil after aluminizing. Lesser penetrations are not as desirable, and diminish the NOX-reducing effect.

While tin can be applied to the catalytic surfaces of the present invention by any of the techniques described above, it can also be applied by having tin present in the leaching solution as described in application Ser. No. 172,671. Thus dissolving 5 to 10 grams of $SnCl_2.2H_2O$ in a solution of 50 grams NaOH in 500 cc water provides a good leach solution that leaves the solution not containing the tin.

Instead of aluminum, zinc can be used as the activating metal diffused into the iron or iron alloy substrate. It diffuses in more rapidly than aluminum so that diffusion times can be reduced about 25% and diffusion temperatures reduced about 250° C.

EXAMPLE VI

An 8 mesh screen woven from 10 mil thick 1010 steel wire is given a vanadizing treatment at 1000° C. in a stream of hydrogen and HCl that has been passed over vanadium as described on page 39 of the Powell et al text and the references cited therein, to form a 1 mil thick case.

The resulting screen is then embedded in a powder pack consisting of 15% by weight zinc powder and 85% by weight powdered alumina, to which pack ½% by weight of anhydrous zinc chloride is added. Diffusion is then conducted as in Example V to cause the screen to pick up about 27 milligrams of zinc per square centimeter of gross wire surface The zincized screen is then subjected to 20% aqueous NaOH for 30 minutes, rinsed and dried, and shows an active surface layer about 2.5 mils thick. This makes a very effective denitrating catalyst with or without any of the other pre-denitrating treatments of U.S. Pat. Nos. 4,040,981 and 4,206,081.

FIG. 1 of the drawings shows the exterior of an oil-fired furnace 10 having a stack 12 partly broken away to show its interior At the base of the stack is fitted a frame 14 holding a pair of screens 21, 22 as indicated in FIG. 2. The frame is fitted to hold the screens so that they extend across essentially the entire cross-section of the stack. The screens have their wires 31, 32 offset and a corresponding offset for their cross wires.

Frame 14 is rotatably mounted in the stack by means of pivot extensions 34, 35, and one of these extensions carries a handle 37 by which the frame can be rotated around the horizontal axis defined by the extensions. The handle also has a pointed end 39 that indicates the rotary position of the frame.

When desired, as for example when the flow of stack gas becomes excessively impeded because particulates have accumulated on the lower face of the lower screen, the frame is rotated 180° C. This permits the flue gases in their upward movement to blow the accumulated particulates off that face.

Instead of rotating frame 14, it can be fitted into a groove extending around the interior of the furnace walls and penetrating completely through one wall. The frame can then be slid into position through that penetrating groove. So positioned it can then be easily removed when desired and replaced in upside-down position. Sonic or ultrasonic vibrator may be connected to the frames to delay trapping and expedite freeing of particulates. Such vibration can be also separately used to help clean a particulate-coated frame that is removed from the stack and immersed in a cleaning bath.

Two screens are generally not enough for most stack denitrations, and additional sets of screens can be used. Also three or more screens can be fitted on a single frame. Spacing one screen from its adjacent screen by a distance at least as large as the widths of the screen openings, helps reduce the trapping of particulates on the screens. Although the screen wires are shown as round in cross-sections, these cross-sections can alternatively be square, rectangular, oval, or of any other configuration.

The screens of the present invention will reduce the nitrogen oxide content of stack gases even when little or no ammonia is present, but it is helpful to add a small amount of ammonia where not enough is present to permit the stoichiometric reaction, e.g.:

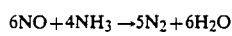
$$6NO + 4NH_3 \rightarrow 5N_2 + 6H_2O$$

Carbon monoxide also helps the screens of the present invention reduce nitrogen oxides to nitrogen whether or not ammonia is present, and carbon monoxide is normally present in significant concentrations in combustion gases. Thus coal-fired furnaces show very little ammonia content in their flue gases, but their carbon monoxide output can be greater than their nitrogen oxide output.

The catalysts of the present invention show their greatest effectiveness at temperatures of about 315° C. or somewhat higher. It is accordingly preferred for the screens to be positioned where the stack gases have these temperatures. When the stack gases contacting these screens are at relatively low temperature, the catalytic efficiency of the screens can be increased by heating them, as by means of a small auxiliary burner mounted under them or by passing an electric current through them.

The catalytic iron and steels are pyrophoric when the leaching of the aluminum or zinc is completed. A little aluminum or zinc remains in the substrate at that point. If the iron or steel contains chromium, the pyrophoricity that is obtained decreases as the chromium content increases.

Masking of chromium-nickel-iron type stainless steels during chromizing is best effected by imbedding in compacted powder the metallic portion of which is 13 to 20 weight % chromium, 6 to 10 weight % nickel, and the balance iron, and is diluted with 1 to 2 parts by weight of $Al_2O_3$. The powder is broken in by a pre-firing. When the chromium content of the metallic portion is above about 17 weight percent, a slight chromizing can be effected right through a layer of masking powder as much as two inches thick. Such chromizing is not necessarily undesirable inasmuch as it assures that chromium has not been depleted from the substrate being masked. By avoiding depletion, the masked surface remains ductile strong and with a somewhat enhanced corrosion resistance.

Where embedment is impractical for the masking, then masking layers can be applied from slurries in volatile solvents as described above. However a ⅛ inch layer so applied is not suitable by itself and is not compact enough to prevent major chromizing. Application over such a coating, of a second layer containing a major amount of iron powder with or without refractory diluent will effectively prevent passage of chromizing vapor to the substrate and also forms a protective sheath. A small content of chromium, about 5 weight % of the total metal content can be added to the second layer, to help assure that there is no excessive depletion of chromium from the first layer and from the substrate.

When substantial quantities of iron and aluminum, or nickel and aluminum, powders are mixed and heated, they react with each other as the temperature reaches about 480° C. and generate large quantities of heat while very rapidly forming the aluminide. Thus for continuous formation of aluminide powders, iron or nickel powders or mixtures of the two can be further mixed with the aluminum powder and then poured onto a moving conveyor of Inconel 600 for example that carries the resulting mixture through an aluminizing atmosphere where the leading edge of the mixture is heated as by a burner or oven to initiate the reaction. When the reaction starts the burner can be turned off, and when an oven is used the oven can be temperature-controlled to reduce or cut off the heat it supplies, at the time the reaction supplies sufficient heat.

Moving metal foils such as said Inconel, that withstand the reaction, make suitable conveyors although the reacted particles tend to adhere to such foils. Where the particles are carried by foils of stainless steel, low alloy steel or plain steel, the adhesion is quite pronounced, so that the reaction product is a foil to which the reacted particles are sintered. No other conveyor is then needed. The reaction can take place so rapidly that no special atmosphere is needed so that it can be conducted in air. A stream of argon can be directed over the exposed moving foil to displace most of the ambient air.

Nickel powder effects aluminide formation with more vigor than iron powder does, and also provides, after leaching out aluminum, a pyrophoric product having somewhat more pyrophoric heat output. The aluminide-forming reaction can seriously degrade the supporting foil when that foil is iron or other metal not very resistant to high temperatures. To minimize such degradation it is preferred that there be no more than about ⅔ atom of nickel for every atom of iron in the powder mixture, and that there be not over about 2.6 atoms of aluminum for every atom of iron and nickel. For the most effective pyrophoricity there should be at least about 2 atoms of aluminum for every atom of iron and nickel. A proportion of 1½ atoms of aluminum for every atom of iron and nickel reacts to form an aluminide mixture that is slow to leach and becomes only mildly pyrophoric.

The aluminide-forming reaction proceeds very quickly after the powder mixture reaches reaction temperature. Where the powder particles are about 40 microns in size, the reaction time is generally not more than about 5 seconds and for smaller particles even less time is required. The use of a supporting foil that absorbs and/or conducts away heat very rapidly such as 0.05 millimeter thick copper, can extend the reaction duration if the powder mixture is in a layer less than about 0.1 millimeter thick. Layers at least 0.1 millimeter thick are preferred where the pyrophoricity is to attain the maximum radiation temperature.

The leaching that renders the aluminide pyrophoric is preferably carried out rapidly, as by treatment with 20% NaOH or KOH in water at about 60° to 95 ° C. for two to three minutes. Higher leaching temperatures and/or higher caustic concentrations further shorten the leach time, but longer leach times can be used as described in the prior art.

The aluminide-forming mixture can have additional ingredients incorporated to improve the pyrophoric output after leaching. A highly exothermic combustible material like powdered boron is very useful for this purpose, and only about 1 to about 4% of such powder in the aluminide-forming mixture is highlY effective. Powdered carbon, magnesium and titanium are also useful additives, but they tend to ignite when the aluminide-forming reaction is conducted in a manner that does not completely shield the reacting mixture from the ambient air.

The following are very desirable exemplifications:

EXAMPLE VII

A length of SAE 1010 steel foil 1/40 millimeter thick has sprayed onto both faces a mixture of, by weight:

53.6 parts—325 mesh aluminum powder
29.6 parts—325 mesh iron powder
16.8 parts—325 mesh nickel powder
3.24 parts—325 mesh boron powder 175.5 grams of the mixture were dispersed in 93 grams of a 4% solution of poly(ethyl methacrylate) in methylchloroform, and sprayed on in that form to apply coatings that yield a pyrophoric product about 17/40 millimeters thick overall.

The foil with the sprayed-on coatings was then air-dried for about one minute and the thus-dried product passed through the heated tube of a tube furnace. The tube is about 25 centimeters long and heated to about 700° C., and a slow stream of argon is introduced into the open-ended tube as the foil passes through. Part way through the tube the coated foil becomes red hot, and on emerging about 40 seconds later it has begun to cool down.

The cooled product is passed through a heated 20% solution of NaOH in water. With the solution between 60 and 95° C., only about 2 to 3 minutes in the solution yields a leached product having an exceptionally high degree of pyrophoricity. That product, which is about 17/40 millimeters thick, is further improved by rolling it down between pressure rollers to a thickness of about ¼ millimeter.

The pyrophoric product is also improved by subjecting it, before or after rolling, to the post-treatment with citric acid or other mild acid as described in parent application Ser. No. 28,741, the contents of which are incorporated herein as though fully set forth. The magnitude of the resulting improvement diminishes as the nickel-to-iron proportion increases.

The coating mixture can be applied by other techniques, such as by roller coating or by dipping the foil in a suspension of the coating mixture, or by merely pouring the powdered mixture on a surface of the foil while the foil is held with that surface extending in a horizontal plane. The binder content in the coating mixture can be reduced and even completely eliminated, particularly where only the upper face of the foil is coated. Such a one-sided coating can, after the aluminide formation, be repeated on the other face of the foil if desired.

The pyrophoric material is quite porous both before and after rolling, and can be impregnated with liquid or powdered materials as above noted that also improve the pyrophoricity, as by adding exothermic heat and/or varying the spectral response of the pyrophorically heated material.

Reducing the boron content of the original mixture to 1 part by weight, reduces the pyrophoricity somewhat. Eliminating the boron altogether, further reduces the pyrophoricity. Increasing the boron content to 6 or as much as 20 parts by weight increases the pyrophoric heat output. Powdered magnesium and/or titanium behave similarly.

It is preferred to incorporate the foregoing additive in the original powder mixture inasmuch as this reduces the intensity of the aluminide-forming reaction. However the additives can alternatively or additionally be incorporated in the leached product, as by suspending the additives as finely-divided powders in a liquid like water, and slurrying such suspension over the leached product.

The aluminide-forming reaction can alternatively be moderated by reducing the content of the nickel powder, reducing the content of the aluminum powder, or by adding diluents such as pre-formed iron or nickel aluminides as disclosed the parent applications.

Increasing the nickel proportion or the aluminum proportion beyond the limits set out above makes the aluminide-forming reaction so vigorous that it causes the degradation of an iron foil on which the reaction takes place. It appears that such iron foil becomes aluminized and embrittled, as well as weakened by the high temperature of the aluminide-forming heat generation. The resulting foil breaks and falls apart fairly readily.

An iron foil 1/20 millimeter thick withstands such degradation a little better than a foil half as thick, but it is preferred to keep within the limits set out above, even for the thicker foil.

EXAMPLE VIII

A mixture is prepared of the following powders, each about 10 microns in particle size:

Iron—One atom
Aluminum—2.5 atoms
Copper—0.1 atom

This mixture is dispersed in the binder solution of Example VII, sprayed onto both faces of its steel foil about 2.5 centimeters wide and about 25 microns thick and subjected to heat-induced reaction and subsequent leaching as in that example. The resulting product is illustrated in FIG. 3, and shows very good adhesion between the aluminide particles 50 as well as between those particles and the foil 60. On flexing this product much fewer particles break off as compared to the corresponding product of Example VII.

Rolling of the FIG. 3 product between steel rollers 9 centimeters in diameter biased toward each other by a force of 20 kilograms, compacts the product to the still-porous condition illustrated in FIG. 4 in which its thickness has been reduced from about 425 microns to a compact 250 microns. In general such compacting is very desirable and such aluminide coatings are preferably compacted to about half to ¾ of their original thickness.

The addition of 1 to 20% powdered boron to the initial powder mixture as in Example VII, or to the aluminide reaction product before or after leaching or after compacting, substantially increases the pyrophoric heat output of the product.

Omitting the copper from Example VIII reduces the adhesion of the iron aluminide particles or of nickel aluminide particles to iron and steel foils. At least about 1/30 atom of copper for each atom of iron and nickel, will provide such increased adhesion, and more than ¼ atom of copper is not desirable.

Foils of low alloy steels, i.e. iron alloyed with not over 5% other metals, behave like SAE 1010 steel and like Armco iron, in respect of their poor resistance to the aluminide-forming reaction heat.

The hot aluminide-carrying foil can be directly introduced into the leaching bath before the foil cools down to the bath temperature. Due to its large surface-to-mass ratio only about 15 to 20 seconds cooling will get it down to a temperature at which it does not cause violent localized boiling as it enters the bath, particularly if the cooling is aided by a blanketing stream of cool protective gas like argon or nitrogen. The leached product is preferably between about 0.3 and 0.7 millimeters thick. The activated foils can also be prepared by applying on a metal foil or gauze carrier, as by Schoop spray, an adherent coating of iron and nickel aluminides having a sufficiently high aluminum content, and then subjecting such aluminide-carrying webs to the leaching treatment that extracts aluminum and develops pyrophoricity. Inasmuch as the leaching reduces the adhesion, the coated web is preferably heat treated at a temperature of 700° C. or higher to increase the adhesion before leaching. It is also preferred to keep the aluminum proportion to between 1½ and 2 atoms for every atom of iron and nickel. Before leaching, the coated web can be between about 25 and about 400 microns thick, but thicknesses not over about 50 microns are preferred inasmuch as they leach through much more readily. The foil or gauze should be as thin as practical, generally less than 25 microns thick.

The leaching should remove about ½ to about ¾ of the aluminum in the aluminide, or should proceed until the leaching reaction slows down to an insignificant rate. Thus a 13 micron thick iron foil coated with $FeAl_2$ to a total thickness of 50 microns will be adequately leached through in about 5 minutes or less by a 20% solution of NaOH or KOH in water at a temperature at least as high as 60° C. At boiling temperature or with higher concentrations of caustic, the leaching only takes about two minutes.

After leaching, the leached web is pyrophoric and should be kept out of contact with oxygen or air until ready for use. It can be rinsed with water and then subjected to the mild acid treatment of application Ser. No. 28,741 as noted above.

The leached foil is sufficiently porous to pick up 1 to 2% very finely divided boron powder from a slurry in water or methylchloroform. Adding about 1% resin binder to such slurry helps with the boron pick-up and also causes some boron powder to adhere to the outer face of the foil.

Alloying from about 1 to about 10% boron in the original aluminide foil makes it unnecessary to add boron by an after-treatment. Such alloying can be conventional melt alloying, or diffusion boronizing.

Before or after activation the foils can be cut into strips suitable for use as heat-seeking missile decoys. Cutting after activation is preferably conducted under water or in an argon or nitrogen box.

Alternatively small strips of the original aluminide foil can be prepared and they can be leached as by loading them in a perforated basket which is then lowered into the leaching bath for the appropriate time. Upon completion of the leaching, the strips can be rinsed as by lowering the basket into rinse water. After the rinsing the basketful of strips can be dipped into the mild acid bath that increases their pyrophoricity, and then again rinsed.

The original small strips of foil can be prepared for treatment by cutting up a long foil or by forming the strips from molten aluminide as described for instance in U.S. Pat. No. 4,755,353.

A particularly desirable technique for improving the spectral response of a pyrophoric web is to provide a face of the web with a highly specular surface which in turn has its external face coated with an alkali metal silicate. The highly specular surface can be polished metals like stainless steel, copper, aluminum or silver and should have a specular reflection of at least about 70% to red light. The alkali metal silicate preferably has an $SiO_2$: $M_2O$ mol ratio between about 2 and about 5, and should be at least about 10 microns thick.

Where the pyrophoric web already contains a specularly-surface metal foil like stainless steel, the alkali metal silicate can be applied directly to that specular surface. Sodium or potassium silicates having a 3.22 mol ratio are very effective.

The specular surface can be provided by cementing a specularly-surfaced foil to a face of the pyrophoric web, or by metallizing that face with aluminum at high vacuum. High vacuum deposited aluminum flakes are available in the market place and can be deposited from suspension in a binder-containing volatilizable liquid. An aqueous solution of the alkali metal silicate can be used as a cementing material or as the above-mentioned binder. The face of the pyrophoric web to which a separate specular surface is applied, can be the face of the pyrophoric aluminides before or after rolling, and before or after leaching can be the face of a supporting foil or screen. Where a specular foil is applied, that foil should be very thin, less than about 25 microns thick.

A little boron or chromium oxide can be suspended in the alkali metal silicate to further improve the spectral response, as described infra.

As noted, the supporting foil or screen can be a highly exothermic easily ignitable metal such as zirconium or titanium, whether or not any spectral-response-adjusting coating is applied.

The ignition temperatures referred to above are the lowest temperatures at which the metals there discussed ignite in air. pyrophoric metals react and ignite at extremely low temperatures and are accordingly not considered as having an ignition temperature. When an ignition temperature is mentioned it is accordingly in connection with a material that is not pyrophoric. Carbon and boron, both of which are ignited by the pyrophoric metals, can be considered ignitable metals for the above purposes.

The radiation characteristics of a burning carbon fiber web are also improved by coating it with borosilicate or borochromate particles in which the boron oxide content is from about 5% to about 50%.

About a 1/10 to 15-mil thick layer of pyrex glass particles ground to about 200 mesh and adhered to one face of a 5 to 30-mil thick carbon fiber cloth, provides a radiation pattern particularly desirable for decoying heat-seeking missiles. A little binder solution such as that used in connection with Example VII can be used to secure such coating in place, so that all that is needed is to spray on the binder solution containing the powdered glass particles suspended in it, and then permitting the sprayed-on coating to dry.

The sizes of the individual glass particles should be from about 10 to about 100 microns.

A further improvement in the foregoing radiation characteristics is obtained when a layer of aluminum particles is interposed between the powdered glass coating and the carbon fiber cloth. Such aluminum layer can be from about 1/10 to about 1-mil thick, can consist of aluminum particles also about 10 to about 100 microns in size, and can be applied the same way described above for the glass particles. Drying of the binder-containing aluminum particle layer permits the spraying over it of the glass particle layer without excessive smearing of the aluminum particles. Aluminum alloys containing at least about 80% aluminum can be used in place of pure aluminum.

A very effective coated and self-igniting carbon fiber cloth is prepared by starting with a 16-mil thick cloth that is activated by pitting and coating with lead acetate in accordance with the prior art. On one face, there is applied a ½-mil thick layer of aluminized particles, which is dried and followed by a 11.5-mil thick layer of particles of the following glass composition, by weight:

72%—SiO
25%—$B_2O_3$
0.5%—$Na_2O$
1%—$Al_2O_3$
1%—$K_2O$
0.5%—$Li_2O$

The resulting material is dried again and is now placed in an argon box. While in an argon atmosphere the uncoated cloth face is sprayed with a 16.5-mil thick layer of 25 mesh pyrophoric iron particles, dried and the pyrophoric layer then top-coated with a 0.5-mil thick layer of the same glass particles previously applied. Another drying step, still under argon, completes the product When that completed product is exposed to air, its pyrophoric coating promptly ignites and then ignites the carbon fibers of the cloth. The entire cloth burns away and in doing so very effective radiation is generated.

The last borosilicate layer can be omitted without seriously detracting from the radiation effectiveness.

Another borosilicate that can be used is a simple pyrex formulation of:

13.8%—$SiO_2$
13.8%—$B_2O_3$
4.0%—$Na_2O$
1.6%—$Al_2O_3$

Simple mixtures of $B_2O_3$ and $SiO_2$, as well as of $B_2O_3$ and $Cr_2O_3$ are also effective, but are not as effective unless sintered or fused together.

Melt alloying iron with sufficient aluminum to make an aluminide ranging from $FeAl_2$ to $FeAl_3$ and with 5 to 20 percent of boron by weight of the iron, provides a product that can be ground and readily leached of sufficient of its aluminum to give a very effective pyrophoric powder. A correspondingly made nickel alloy is similarly suited. The radiation effectiveness of such powders, as well as of the boron-containing products of Examples VII and VIII, is improved by adding some silicon or silicon dioxide, preferably as a surface coating. In general, the boron to silicon ratio should have about 5 to about 50% boron.

The pyrophoric particles or the porous members carrying such particles are effective solid fuels that can be injected into turbine engines to burn and thus operate such engines. For this purpose the particles and the porous members should be very finely divided so that they burn rapidly. In order to simplify the storage of the particles, their surfaces can be coated or impregnated so as to prevent pyrophoric action until after the particles are injected into the engine intake where the elevated temperatures normally at the intake will then cause the particles to ignite.

Thus the particles can be dipped in liquid perfluoroalkane having a boiling point of 215° F., then removed from the liquid and dried by rolling them over paper towels, or blowing argon over them, until they appear to be free of surface liquid. Notwithstanding that appearance, the particles do not spontaneously ignite when merely exposed to air, even upon ten days exposure to air.

However when exposed to air and heated to about 150° C. they promptly ignite and then go through a complete combustion. At this ignition temperature it appears that residual liquid in the porous surface of the particles is driven off to permit the pyrophoric action.

Similar results are obtained with hydrocarbons or other relatively inert liquids that have boiling points of at least about 200° C. Paraffin wax also behaves similarly but requires a temperature of at least about 250° C. to be ignited. Pyrophoric iron or other metal powders so treated make particularly desirable solid fuels for turbine engines which have compressor sections that operate at temperatures sufficiently high to effect the foregoing ignition. Such metals can be relatively soft so that they do not excessively erode the engine as they move through it. Alloying boron or carbon or both with these metals increases their hardness but gives less erosive combustion products. It is accordingly preferred to add carbon as finely divided graphite particles, or as graphite coatings on the pyrophoric particles.

For engines in which the intake temperature is at least as high as 300° C., pyrophoric action is so markedly accentuated that more than 30 weight percent boron can be alloyed with iron or nickel that is subsequently pyrophorically activated, without swamping out the pyrophoricity. The boron content can be increased to about 50 to 60 weight percent for still higher intake temperatures. It is preferred to have no more than about 70% boron in such an alloy inasmuch as at higher concentrations the boron burns to a sticky liquid boron oxide that coat the surfaces of the burning particles and seriously hinders or prevents further combustion.

Palladium is best catalytically activated with zinc. A simple diffusion of about 1 to 30 milligrams of zinc per square centimeter of palladium surface, followed by leaching with strong. at least 10%, HCl in water at 95° C., produces from a 1 mil thick foil a very effective catalyst. A typical pack diffusion treatment for palladium is the embedding of a 52-mesh palladium screen the wires of which are 4 mils thick, in a pack of 20% powdered zinc and 80% alumina, energized with ½% $NH_4Cl$, and heating for 4 hours at 315° C. in a hydrogen-bathed or argon-bathed atmosphere. This effects a zinc pick-up of 4 mg/cm$^2$, essentially all of which is leached out by 20% HCl in 10 minutes. The resulting screen is pyrophoric when exposed to air.

Zinc can be similarly diffused into titanium foil in a hydrogen-bathed or argon-bathed atmosphere from such a zinc-containing pack. As an example a 4 mil thick titanium foil is embedded in a pack having the following composition:

80 g—Zn
16 g—Al
305 g—$Al_2O_3$
4 g—$AlCl_3$ and subjected to 10 hours of diffusion at 510° to 540° C. The foil picks up about 3.5 milligrams of zinc per square centimeter. It is worthy of note that the titanium does not become seriously embrittled by such treatment, and can be bent around a ⅛-inch radius without cracking.

The diffused-in zinc can be leached our with 20% boiling NaOH solution to leave a very active catalytic surface. Titanium activated this way still retains a little of the zinc and can be used as a conventional electrolysis electrode or as a substitute for the photosensitive electrodes described in the Augustynski et al paper in the Journal of the Electrochemical Society, Volume 124, No. 7, pages 1063-64 (1977).

Titanium activated by aluminizing and leaching can also be so used Such titanium, still containing a little of the aluminum, can be heated in air or under other oxidizing conditions to convert some of its porous activation case to mixed titanium aluminum oxides and such a treated titanium makes a very effective photo-anode for photolysis of water containing a little NaOH. Even without the heat-treatment it is a very good photoanode. Tin can also be diffused into titanium to provide similar results with and without the subsequent oxidation.

Whether the zincized, aluminized or stannized titanium is used as a photo-electrode, a platinum or platinized platinum or activated platinum counter-electrode is helpful. Activated platinum made as described in U.S. Pat. No. 4,154,705 is particularly helpful A little ruthenium, such as 1 to 5% by weight can be incorporated in the titanium before it is aluminized, zincized or stannized, as a further improvement.

Instead of using separate electrodes for the photolysis, they can be provided in powdered form and mixed with each other as well as with other substances such as cadmium sulfide that also help with the photolysis.

Hydrogen proxide appears to form during the foregoing photolysis and some exothermic heat is also generated and can be used to help keep the photolysis combination warm.

The pyrophoric effects of the Raney-type activated metals is improved by diffusing boron into the Raney surface before it is activated. This is shown in the following example:

EXAMPLE IX

Three-hundred grams of powdered 325 mesh $FeAl_2$ is thoroughly mixed with 10 grams powdered boron and 6 grams of powdered $NaBF_4$. The mixture is placed in a carbon steel retort which is then fitted into a tube furnace, and heated while a flushing gas is passed through the tube as in Example 1. A heat of 980° C. held there for 1½ hours under hydrogen, introduces about 7% boron into the $FeAl_2$ powder, based on its iron content.

The retort contents are partially sintered together as a result of the diffusion heat, but can be fairly easily removed from the retort after banging the outside of the retort with hammers or mallets. Crushing and/or grinding readily reduces the mass to very small particle size. Then on leaching aluminum out of the resulting product mass as by a 60-minute treatment in 15-16% aqueous NaOH that is cooled to keep it below 50° C. followed by washing, the activated particles remaining are quite pyrophoric and on exposure to air heat up to temperatures of about 540° C. Higher and lower leaching concentrations and temperatures can also be used, but are less desirable.

Longer diffusion boronizing provides, after leaching, an activated iron-aluminum-boron alloy powder containing as much as 30% boron based on the weight of its iron, and which upon exposure to air heats up to over 650° C. Boron contents greater than about 30% provide decreasing heat-up and at about 40% leave the leached powder non-pyrophoric. It is preferred that the boron penetrate through the entire thickness of each powder particle and that each particle have a uniform composition throughout its thickness.

Similar results are obtained when $FeAl_3$ powder is used in place of the $FeAl_2$, when alloys of intermediate proportions are used, and when the corresponding nickel-aluminum alloy are used. Some of the alloys are not as brittle, and therefore not as easily grindable as others. If the iron-aluminum alloy powder particles being boronized are over about 1 millimeter in size, the boronizing treatment times should be substantially lengthened if the boron penetration is to be complete. Other boronhalides such as ammonium fluoborate, $BBr_3$ and $BI_3$ can be used as energizers. In general the energizer content of the pack should be from about 1 to about 3% by weight, and the diffusion temperature at least about 760° C.

By not using an inert refractory diluent in the boronizing pack, it becomes unnecessary to later separate such diluent from the boronized powder.

The foregoing boronizing of self-supporting substrates such as foils requires much more care and should be conducted with inert refractory diluent in the pack. Thus conducting the same boronizing on lengths of one-mil thick aluminized iron foil is awkward because such foil is extremely brittle and difficult to handle. The following is a preferred example.

EXAMPLE X

Such boronizing can be satisfactorily effected in the following powder pack:
  200 grams—powdered alumina
  10 grams—powdered boron
  5 grams fluoborate, sodium or ammonium at 510° C. for 18 hours, or at 565° C. for 3 hours, in a hydrogen-bathed atmosphere. The boron then penetrates about half way through the aluminized case.

Aluminum loss to the boron in the pack also takes place. The aluminizing of an iron-boron alloy in an attempt to introduce sufficient aluminum to give a pyrophoric product after leaching, causes excessive loss of boron from the substrate to the pack.

The activated powders containing boron, or even free o boron, are stored out of contact with air or oxygen to preserve their pyrophoricity. Water is not a suitable preserving liquid for the activated boron-containing powders. Acetone preserves them for at least three weeks, as does an azeotropic mixture of Trifluorotrichloro ethane with methylene chloride, described in U.S. Pat. No. 2,999,817. Ordinary fluoro-chloro ethanes and methanes that are normally used as refrigerants or propellants are also suitable and they can be used by themselves or mixed with each other or with acetone. Mixtures of the activated powders with preserving liquids that are also propellants, are particularly desirable in that they can be packed in an aerosol-type container from which they are readily discharged to provide a cloud of pyrophorically oxidizing particles.

Titanium can also be aluminized and/or boronized by the same type of treatments, to make it more resistant to corrosive attack. For this purpose the aluminum is not leached out. It is also very desirable to diffusion coat titanium in the absence of hydrogen and in the complete or substantially complete absence of conventional halide activators like $AlCl_3$ and $NH_4Cl$. Thus engine compressor blades made of Ti6A14V can be embedded in a pack of 20% Al-Si alloy powder containing 12% silicon, and 80% alumina, completely free of energizer, and at 700° C. for 14 hours under argon, acquires a protective aluminide case 0.5 to 1 mil thick. Using pure aluminum instead of the Al-Si alloy reduces the case thickness by about half.

Adding ¼% $AlCl_3$ or $NH_4Cl$ energizer to the pack cause the titanium substrate to be significantly embrittled. However the aluminizing can be speeded by using a pack that had been pre-fired with such a halide energizer for a time long enough to drive out essentially all the energizer—at least one to two hours at 370° C. or higher. It appears that some energizer remains or some change is caused to make the pre-fired pack much more effective in aluminizing the titanium. In any event the resulting aluminizing produces thicker cases, and can be readily effected at temperatures as low as 535° C. or in times as short as 5 hours.

The addition to the pack of about 1/10% of a titanium halide such as $TiCl_2$, preferably sealed in a polyethylene tube so as to be protected against exposure to the atmosphere, is also helpful to speed up the diffusion coating. The polyethylene tube melts before the pack reaches diffusion temperature, releasing its contents.

The aluminized titanium compressor blades can then be boronized instead of or before applying a top coating as described above. A suitable boronizing pack for this purpose is a diluent-containing pack otherwise corresponding to that of Example VII, using ammonium fluoborate as the energizer and with added titanium powder in an amount about half the amount of boron powder, by weight. A 0.3 mil boronized case is thus formed at 580° C. for 14 hours in argon. The titanium powder helps keep the titanium substrate from being attacked by the halide in the pack, and can also be added to the pack used for aluminizing titanium. It can also be omitted, particularly when only a thin diffusion coating is desired. When the powdered titanium is used, it can range from about 1/5 the boron content to about equal the boron content by weight. Boron being a very high melting material, it can be used with little or no refractory diluent, particularly at diffusion temperatures low enough to keep the workpiece surfaces from reaching a sintering condition. On the other hand, the boron content of a boronizing pack can be as low as 2%, although at least 4% is preferred. To be sure that no sintering takes place an inert refractory diluent like $Al_2O_3$, kaolin or MgO can be present in the pack in a concentration of at least 30%.

The re-use of packs containing sodium fluoborate energizer can be complicated by the gradual build-up of sodium fluoride with each use. This problem does not appear to arise when ammonium fluoborate is the energizer.

Obviously many modifications and variations of the present invention are possible in light of the above teachings. It is therefore to be understood that within the scope of the appended claims the invention may be practiced otherwise than as specifically described.

What is claimed:
1. The process of preparing a pyrophorically modified foil, in which process a metal foil about 0.02 to about 0.05 millimeters thick has applied to its surface a layer of a mixture of powdered aluminum, iron and nickel which is then heated to cause the powders to inter-react without materially degrading the foil, to form iron and nickel aluminides having at least twice as many aluminum atoms as nickel and iron atoms and sintered to the foil, and the resulting foil is leached to remove some of the aluminum from the aluminides and thus to develop pyrophoricity.

2. The combination of claim 1 in which the powder mixture has not more than about 2.6 atoms of aluminum for each atom of iron and nickel.

3. The process of claim 1 in which the powder mixture also contains powdered boron in an amount about 1 to about 4% by weight.

4. The process of claim 1 in which the foil is an iron foil.

5. The process of claim 1 in which the powder mixture is applied in a layer that leaves the leached product about 0.3 to about 0.7 millimeters thick.

6. The process of claim 5 in which the leached product is rolled under pressure to reduce its thickness by about ¼ to about ½.

7. The process of claim 1 in which the aluminide surface of the leached product is porous and in its pores there is introduced a finely divided material that does not block pyrophoric action but is ignited by such action to generate added heat.

8. The process of claim 1 in which the leached product is subjected to a mild acid treatment to increase its pyrophoric heat output.

9. The process of claim 1 in which the leached product carries a radiation-improving powder.

10. The continuous production of nickel and iron aluminides, which production is characterized by pouring onto a moving carrier belt a mixture of powdered aluminum and powdered nickel or iron, and in a suitable atmosphere heating the leading edge of the moving mixture to cause the powered metals to interact.

* * * * *